(12) United States Patent
Wolke et al.

(10) Patent No.: US 6,539,956 B1
(45) Date of Patent: Apr. 1, 2003

(54) METHOD AND DEVICE FOR DRYING SUBSTRATES

(75) Inventors: Klaus Wolke, Althengstett (DE); Martin Weber, Bad Dürrheim (DE)

(73) Assignee: Steag Microtech GmbH (DE)

( * ) Notice: Subject to any disclaimer, the term of this patent is extended or adjusted under 35 U.S.C. 154(b) by 0 days.

(21) Appl. No.: 09/114,420

(22) Filed: Jul. 10, 1998

Related U.S. Application Data

(63) Continuation-in-part of application No. PCT/EP97/01537, filed on Mar. 26, 1997.

(51) Int. Cl.[7] ................................................. B08B 3/10
(52) U.S. Cl. ........................ 134/61; 134/105; 134/902
(58) Field of Search ......................... 134/902, 1, 1.3, 134/201, 105, 61, 95.2; 34/60, 68, 69

(56) References Cited

U.S. PATENT DOCUMENTS

| | | | |
|---|---|---|---|
| 4,722,752 A | | 2/1988 | Steck |
| 4,902,350 A | | 2/1990 | Steck |
| 4,960,141 A | | 10/1990 | Lenck et al. |
| 5,323,269 A | * | 6/1994 | Walker et al. ............... 359/739 |
| 5,481,516 A | * | 1/1996 | Kim .......................... 369/44.12 |
| 5,530,410 A | * | 6/1996 | Chu .......................... 333/153 |
| 5,556,479 A | * | 9/1996 | Bran .......................... 134/1.3 |

FOREIGN PATENT DOCUMENTS

| | | |
|---|---|---|
| DE | 3733670 | 10/1987 |
| EP | 0328746 | 5/1989 |
| EP | 0385536 | 9/1990 |
| JP | 322427 | 11/1986 |
| WO | 9708742 | 3/1997 |
| WO | 9738438 | 10/1997 |

OTHER PUBLICATIONS

Patent Abstract Japan 61–281005; Oct. 19, 1988; vol. 12/No. 393.
Patent Abstract Japan 2–108035; Apr. 14, 1992; vol. 16/No. 150.

* cited by examiner

*Primary Examiner*—Philip R. Coe
(74) *Attorney, Agent, or Firm*—Robert W. Becker & Associates

(57) ABSTRACT

In a method for drying substrates, in particular, semiconductor wafers, an especially residue-free drying of the substrates results when, during removal of the substrates from a liquid, a meniscus of the liquid forming at the transition between the substrate surface and the liquid surface is heated. A device for performing the method is disclosed.

4 Claims, 1 Drawing Sheet

METHOD AND DEVICE FOR DRYING SUBSTRATES

This application is a continuation-in-part application of International Application PCT/EP97/01537 with an international filing date of Mar. 26, 1997.

BACKGROUND OF THE INVENTION

The present invention relates to a method and a device for drying substrates.

European patent application 0 385 536 discloses a method and device for drying substrates after treatment in a liquid. According to the method known from this printed document, substrates are treated for a period of time in a bath that contains a liquid and are then removed so slowly that practically the entire liquid remains within the bath. In so doing, the substrates are brought directly from the liquid into contact with a vapor. The vapor does not condense on the substrate and mixes with the liquid whereby the mixture has a lower surface tension than the liquid. This method, however, is very complicated in practice because vapor is required and must be removed, and, in particular, supply lines and exhaust nozzles for the vapor must be made available.

From U.S. Pat. No. 4,722,752 a device and a method for cleaning and drying of disc-shaped substrates, for example, semiconductor wafers, is known in which the heat energy remaining in the substrates is used to generate a surface tension gradient. External heat is not supplied for improving or accelerating the drying process.

U.S. Pat. No. 4,920,350 shows and discloses a device and a method for cleaning and drying substrates whereby at the surface of the liquid energy in the form ultrasound is supplied to the substrate upon removal. The supplied energy however does not serve for drying but for cleaning.

The washing and drying method known from U.S. Pat. No. 5,368,649 for mechanical or electronic components as well as lenses employs for improvement of the drying method a liquid which is maintained at a pressure that is above atmospheric pressure. The rinsing liquid is heated above the boiling point defined at atmospheric pressure. For the drying process, the workpiece is introduced into a drying chamber in which a sudden decompression takes place so that the rinsing liquid on the workpiece evaporates quickly.

The invention has the object to provide a method in which the substrates during removal from the fluid bath can be dried quickly, at minimal expenditure, without impacting the environment, and without residues forming on the substrates.

SUMMARY OF THE INVENTION

The inventive objective is realized with a method of the aforementioned kind in that during withdrawal of the substrate from the liquid, a liquid meniscus that is formed at the transition between the substrate surface and the liquid surface is heated.

One advantage of the present invention is that with the inventive process the substrate is very rapidly dried, without great technical expenditure, such drying being very thorough and without mechanical stressing during the withdrawal of the substrate from the liquid bath.

Pursuant to one specific embodiment of the invention, electromagnetic radiation is used for heating the meniscus of the liquid. Such radiation has the advantage that it can be generated very easily, passes through certain materials, such as a hood over the liquid bath, and can be very easily focused upon the meniscus of the liquid.

The electromagnetic radiation preferably comprises microwaves, infrared radiation, and/or visible radiation.

According to a very advantageous embodiment the meniscus is heated by a gas whereby a heat exchange from the gas onto the meniscus takes place. This provides for a simple, efficient heating of the meniscus whereby, preferably, at least one hot gas stream is generated and directed onto the meniscus and/or the meniscus is surrounded by a hot gas that heats the meniscus. In the latter case, convection of the gas is advantageous. The local heating of the meniscus effects a reduction of the surface tension within the curved meniscus area that forms upon removal of the substrate between the substrate surface and the surface of the liquid. In this manner, the liquid present within the meniscus, respectively, adhering to the substrate surface, is moved away from the meniscus, respectively, away from the substrate surface so that the substrate can be quickly and reliably freed of the liquid and dried substantially without additional measures during lifting from the liquid. The use of hot gas as an energy transmitting medium for heating the meniscus provides an especially simple and advantageous possibility for heating the meniscus.

For heating the meniscus of the liquid, hot nitrogen is advantageously used that is guided to the liquid surface such that the liquid in the area of the meniscus experiences a greater temperature increase then the liquid area outside of the meniscus. In doing so, the gas may be stationary as well as in the form of a gas flow. The gas is preferably introduced via a hood that can be placed above the liquid.

It should be noted that heating, in general, refers to a heating of the meniscus relative to the other areas of the liquid whereby these temperature differences can be optionally small and even within the magnitude of less than 1° C.

Preferably, the heating gas is an inert gas in order to avoid reactions of or chemical effects on the substrates caused by the gas. As a heating gas nitrogen is advantageous, but noble gases are also well suited. The gases are preferably not miscible with the liquid.

According to one very advantageous embodiment of the invention, a gas is employed that reduces the surface tension of the liquid from which the substrates are removed. This effect, known as the Marangoni effect, contributes additionally to an excellent and fast drying of the substrates. Preferably, the gas for reducing the surface tension of the liquid is nitrogen, isopropyl alcohol, or a gas mixture containing at least one of theses gases. The gas for reducing the surface tension of the liquid is preferably also used as the heating gas for heating the meniscus. The heating gas is directed onto the meniscus advantageously via a hood which can be placed above the liquid container from which the substrates are to be removed. Examples for introducing the gas via a hood are disclosed in conjunction with introduction of gases for reducing the surface tension of the liquid in German patent application 44 15 077, assigned to the assignee of the instant application and incorporated by reference into the present application.

According to an alternative or additional method variation, the object of the invention is also solved in that the meniscus is heated by the substrate that contacts the meniscus, whereby the substrate or substrates before and/or during removal from the liquid are heated. The heating of the meniscus by the substrate, which is brought to a temperature greater than the temperature of the liquid, provides a further very advantageous solution to the inventive object.

In connection with the heating of the meniscus by the heated substrate, it is especially advantageous when before and/or simultaneous to the heating of the meniscus a vapor or gas, that mixes with the liquid of the meniscus, is brought into contact with the meniscus. In this manner, it is possible to additionally decrease the reduction of surface tension, resulting from heating of the meniscus, by the Marangoni effect and to thus improve and accelerate drying.

The inventive object is also solved in regard to a device for drying of substrates with an energy source for heating a meniscus, which forms upon removal of the substrates from the liquid at the transition between the substrate surface and the liquid surface, in that the energy source is a hot gas that surrounds the meniscus or flows onto the meniscus. In the first case, the device has a heating device that heats the gas surrounding the meniscus. As an example of such a heating device, infrared or ultrasonic energy sources are advantageous, but also eddy current heaters.

A further solution of the inventive object, as an alternative or in addition to the aforementioned devices, is that the energy source for heating the meniscus is the substrate itself which during removal of the substrates is warmer than the meniscus. The substrate is preferably heated before and/or during removal from the liquid.

Preferably, the inventive methods and devices are employed in connection with drying of semiconductor wafers, whereby the efficiency of the drying process and its reliability are improved and the drying period is decreased so that the productivity of the inventive method and of the inventive device is increased.

Pursuant to a further preferred specific embodiment of the invention, when the substrates are withdrawn from the liquid bath they are brought into direct contact with a vapor that does not condense upon the substrate and contains a substance that is miscible with the liquid and, when it is mixed with the liquid, results in a mixture that has a lower surface tension than does the liquid. As a consequence of the combination of the inventive method with the method known from the aforementioned European patent application 0 385 536, there results for particular applications an additional improvement and acceleration of the drying of the substrates.

The substrates are advantageously lifted and lowered by a blade-like lifting mechanism. The blade-like lifting mechanism carries the substrates, when they are raised out of the liquid, and in particular at those locations of the substrate that are the last to leave the liquid. Drops of the liquid then flow off the substrate over the blade-like edge of the blade-like lifting mechanism, so that when the substrate leaves the liquid bath, at which point a meniscus is no longer defined, the drying process can continue at the same efficiency.

BRIEF DESCRIPTION OF THE DRAWINGS

The invention, as well as further advantages and embodiments thereof, will be explained subsequently in conjunction with schematic illustrations of the inventive process. It is shown in.

DESCRIPTION OF PREFERRED EMBODIMENTS

The invention will now be described in more detail with the aid of FIGS. 1 and 2.

Figure 1:
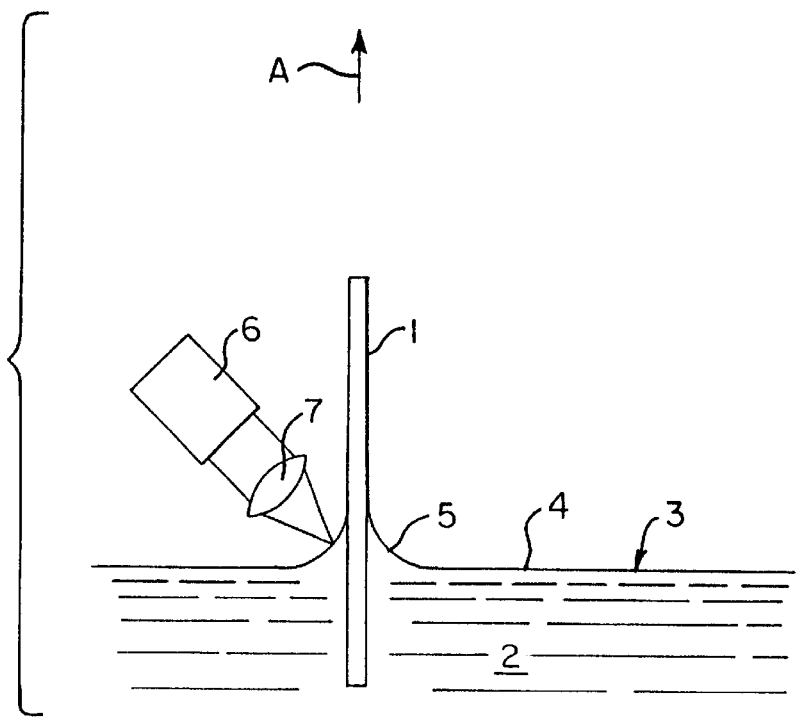
FIG. 1 an embodiment in which the meniscus is heated by an energy beam.

FIG. 1 shows a schematic cross-sectional view for illustrating the inventive drying process. A substrate 1, which is preferably a semiconductor wafer, is raised out of the liquid or fluid bath 2 in the direction of the arrow A. For this purpose, for example, a (non-illustrated) blade-like lifting mechanism can be provided. A liquid surface 3 of the liquid bath 2 has a region 4 in which the liquid surface 3 is planar. In region 5, the liquid surface 3 is curved, i.e., a meniscus of the liquid surface 3 results because the liquid clings to the semiconductor wafer 1 due to adhesion forces. This is the case because the liquid wets the surface of the substrate 1, since the attractive forces of the substrate acting upon the liquid molecules are greater than the attractive forces of the liquid molecules for one another.

A schematically illustrated energy source 6, which is preferably a laser or a device for generating microwaves, for example, a klystron, is provided in order to locally heat the meniscus portion 5 of the liquid surface 3 by means of a focusing mechanism 7, which is, for example, a converging lens. As a consequence of a localized heating in the region of the meniscus, the surface tension in the curved meniscus region 5, which borders the wafer 1, is reduced relative to the planar region 4 of the liquid surface 3, which is remote from the substrate 1. Due to the different surface tensions, there results a drifting or flowing of liquid away from the meniscus 5 to the portion 4 of the liquid surface 3, i.e., away from the substrate 1. As a consequence, the liquid is completely and rapidly withdrawn from the substrate 1. As a result, the substrate 1 can be rapidly dried without further measures and without residue.

Figure 2:
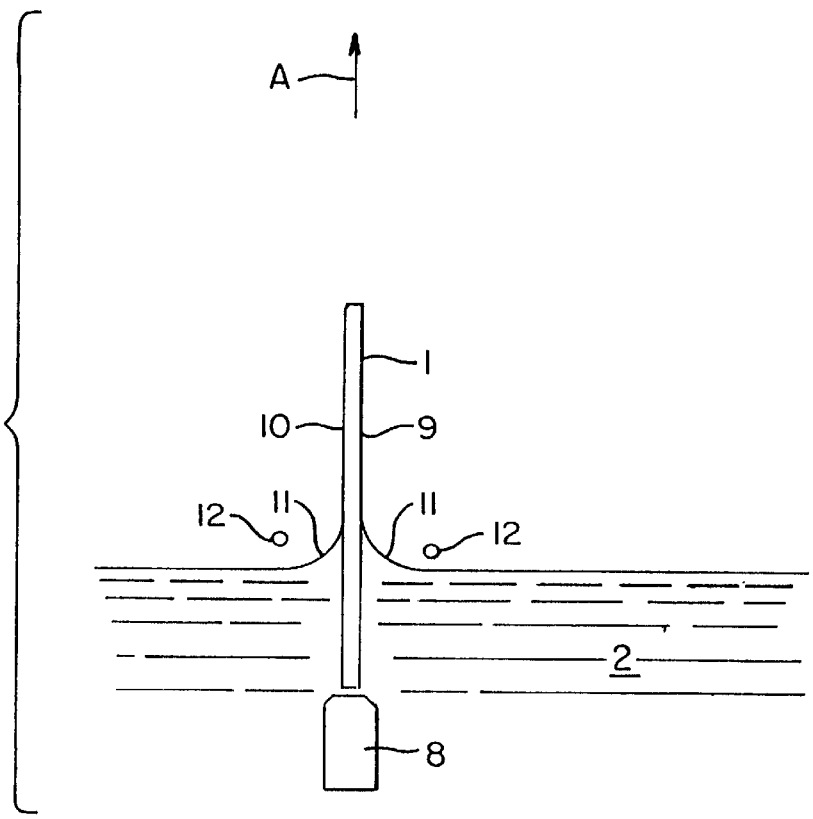
FIG. 2 an embodiment in which the meniscus is heated by a gas.

In the embodiment shown in FIG. 2, the substrate 1, which is, for example, a semiconductor wafer, is lifted with a substrate lifting and lowering device 8 from the liquid 2 in the direction of arrow A. At the transition between the liquid 2 and the substrate surfaces 9 and 10, respectively, a meniscus 11 will form upon lifting of the substrate 1 from the liquid because the liquid wets the substrate surfaces 9, 10 and because the attractive forces exerted by the substrate surface onto the liquid molecules are greater than the forces between the liquid molecules.

At least in the area about the meniscus 11 a gas 12 is present having a temperature that is greater than the temperature of the liquid 2. Thus, the meniscus 11 is heated at least at its surface so that the surface tension within the curved meniscus area 11 bordering the substrate is reduced in comparison to that of the liquid 2. The differing surface tensions effect a flow of the liquid away from the substrate 1 because the liquid molecules among themselves have a greater attractive force in comparison to the attractive force between the liquid and the substrate surfaces 9, 10 when the meniscus area 11 is heated by the surrounding gas 12. In this manner, a substantially improved, more complete, and faster drying of the substrate 1 is possible.

The gas 12 surrounding the meniscus 11 is preferably heated at this location by a suitable energy supply, for example, by an eddy current heater. The gas then transfers its heat energy onto the meniscus 11.

According to an alternative or additional embodiment of the invention it is also possible to direct a stream of heated gas onto the meniscus in order to achieve a directed and local heating of the meniscus 11. Alternatively, the effect of reducing the surface tension of the substrate surfaces 9, 10, respectively, a heating of the meniscus 11 can also be achieved by heating the substrate 1 at least in the area of the forming meniscus 11, for example, in that at least a portion of the substrate 1, before and/or during removal, is subjected to ultrasound for the purpose of heating.

The invention has been explained with the aid of a preferred embodiment. However, a person skilled in the art will find developments and further variations without deviating from the gist of the invention. For example, during removal of the substrates from the liquid bath, the substrates can be directly contacted with vapor which does not condense on the substrate and which contains a substance which is miscible with the liquid and, when mixed with the liquid, results in a mixture that has a reduced surface tension in comparison to the liquid itself. By combining the inventive method with the aforementioned method known from the aforementioned European patent application 0 385 536 in certain applications an additional improvement and acceleration of drying of the substrates will result. According to an advantageous embodiment, the gas 12 used for heating the meniscus 11 can be selected such that it has properties for reducing the surface tension.

Advantageously, the substrates are lifted by a blade-shaped lifting device. The blade-shaped lifting device supports substrates when they are lifted from the liquid in particular at locations of the substrates which leave the liquid last. Drops of the liquid then flow via the blade-shaped edge of the blade-shaped lifting device away from the substrate so that, when the substrate exits from the liquid bath and a meniscus is no longer defined, the drying process can be continued with the same efficiency.

What is claimed is:

1. A device for drying substrates, said device comprising an energy source configured to heat solely a stationary meniscus forming during removal of the substrates from the liquid at a transition between the moving substrate surface and the stationary liquid surface to thereby lower a surface tension of the liquid of the meniscus while the liquid in a region adjacent to the meniscus is not heated.

2. A device according to claim 1, wherein said energy source is a hot gas surrounding the meniscus.

3. A device according to claim 1, wherein said energy source is one or more source selected from the group consisting of an electromagnetic radiation source, a microwave source, a light source, and a laser.

4. A device according to claim 1, comprising a focusing mechanism focusing radiation on the meniscus.

* * * * *